(12) United States Patent
Bahadori

(10) Patent No.: US 12,182,051 B1
(45) Date of Patent: Dec. 31, 2024

(54) MULTI-PURPOSE IO PADS/BUMPS ON SEMICONDUCTOR CHIPS TO MAXIMIZE CHIP-TO-CHIP DATA CONNECTIVITY

(71) Applicant: NUCONCEPTS HOLDINGS LLC, Las Vegas, NV (US)

(72) Inventor: Behzad Bahadori, Santa Cruz, CA (US)

(73) Assignee: NuConcepts Holdings LLC, Las Vegas, NV (US)

(*) Notice: Subject to any disclaimer, the term of this patent is extended or adjusted under 35 U.S.C. 154(b) by 0 days.

(21) Appl. No.: 16/986,004

(22) Filed: Aug. 5, 2020

Related U.S. Application Data

(60) Provisional application No. 62/945,230, filed on Dec. 9, 2019, provisional application No. 62/882,611, filed on Aug. 5, 2019.

(51) Int. Cl.

| | | |
|---|---|---|
| *G06F 13/40* | (2006.01) | |
| *G06F 13/38* | (2006.01) | |
| *H01L 23/00* | (2006.01) | |
| *H01L 25/18* | (2023.01) | |
| *H03M 9/00* | (2006.01) | |
| *H04L 25/14* | (2006.01) | |

(52) U.S. Cl.
CPC .......... *G06F 13/4063* (2013.01); *G06F 13/38* (2013.01); *H01L 24/12* (2013.01); *H01L 24/14* (2013.01); *H01L 25/18* (2013.01); *H03M 9/00* (2013.01); *H04L 25/14* (2013.01)

(58) Field of Classification Search
CPC ..... G06F 13/4063; G06F 13/38; H01L 24/12; H01L 24/14; H01L 25/18; H03M 9/00; H04L 25/14
See application file for complete search history.

(56) References Cited

U.S. PATENT DOCUMENTS

| | | | |
|---|---|---|---|
| 8,082,537 B1* | 12/2011 | Rahman | G06F 30/34 716/54 |
| 2008/0042046 A1* | 2/2008 | Mabuchi | H04N 5/379 257/E27.151 |
| 2016/0372448 A1* | 12/2016 | Yazdani | H01L 23/3107 |
| 2020/0075521 A1* | 3/2020 | Elsherbini | H01L 23/481 |
| 2021/0183773 A1* | 6/2021 | Rubin | H01L 25/18 |
| 2021/0398906 A1* | 12/2021 | Qian | H01L 23/5386 |

\* cited by examiner

*Primary Examiner* — Phong H Dang
(74) *Attorney, Agent, or Firm* — Lance Kreisman; Peninsula Patent Group

(57) ABSTRACT

Multi-purpose interface bumps on semiconductor chips may be used to optimize chip-to-chip data connectivity, including for example high speed chip-to-chip interfaces using fine-pitched bumps adaptable to interfaces with standard bumps without loss of total data rate. A chip with fine-pitch pads for μ-bumps may be connected to an organic package substrate with every other pad populated with a bump and connected to the organic package substrate, while adjacent pads are not populated with bumps and are deactivated. Total number of active bumps to 1/N for each data interface block, and the total bandwidth may be maintained by increasing the active bump data rate by N-times.

8 Claims, 5 Drawing Sheets

MULTI-PURPOSE IO PADS/BUMPS ON SEMICONDUCTOR CHIPS TO MAXIMIZE CHIP-TO-CHIP DATA CONNECTIVITY

CROSS REFERENCE TO RELATED APPLICATIONS

This application claims priority under 35 U.S.C. § 119 to U.S. Provisional Application Ser. No. 62/882,611 filed on Aug. 5, 2019 and titled "Multi-Purpose IO Pads/Bumps on Semiconductor Chips to Maximize Chip-to-Chip Data Connectivity", and to U.S. Provisional Application Ser. No. 62/945,230 filed on Dec. 9, 2019 and titled "A Multi-Gb/s Chip-to-Chip Interface with u-bumps Adaptable to Multi-Gb/s Interfaces with Regular Bumps without Loss of Total Data Rate". Each of the foregoing applications is incorporated by reference herein in its entirety.

TECHNICAL FIELD

This invention relates to integrated circuits, and in particular to multi-purpose interface bumps on semiconductor chips to maximize chip-to-chip data connectivity.

BACKGROUND

Unless otherwise indicated herein, the elements described in this section are not prior art to the claims and are not admitted to be prior art by inclusion in this section.

There are two main approaches to multi chip integration inside a package exist today, including connecting chips over organic package substrates and connecting chips over silicon interposers.

Organic substrates may be used as base materials in semiconductor chips packaging applications and manufacturing. The organic substrates are made of organic small molecules or polymers. Organic small molecules are polycyclic aromatic compounds, such as pentacene, anthracene, and rubrene. Packaging materials are not only used for mechanical or environmental protection of the semiconductor chips, but they also provide electrical interconnect between semiconductor chip and PCBs. Organic packaging materials, similar to other packaging materials, also facilitate heat distribution, signal distribution, manufacturability and serviceability, and power distribution.

In connecting chips over organic package substrates, a relatively low density of pads and the density of wires limits the total data bandwidth between chips. In such approaches, chips on organic substrates should use a standard bump pitch greater than 100 μm, also referred to herein as a coarse pitch bump. While this is a mature and low cost option, it is not typically used for high bandwidth connectivity between chips in a package.

A silicon interposer is silicon-based packaging substrate that provides electrical interface routing between semiconductor chips sitting on it. The purpose of an interposer is typically to provide dense (fine-pitch) wiring connection between semiconductor chips.

In connecting chips over silicon interposers, a high density of pads and the density of wires allows high data bandwidth between chips. Chips on silicon interposers may use microbumps (also referred to herein as "μ-bumps" or "fine-pitch" bumps) with pitch less than 50 μm. Bumps (including standard bumps and/or fine-pitch bumps) may be fabricated using available processes and techniques known to those skilled in the art of semiconductor packaging, and may comprise, for example solder, copper pillars, and/or other alloys or composition of metals such as Sn, Ag, Cu, Ni, Au, Pd and/or other metals or materials deposited, formed or otherwise fabricated (collectively referred to herein as "deposited") on a chip to provide desired physical and electrical interconnect between chips, substrates, interposers, PCBs, and/or other IC components. For example, in some embodiments fine-pitch bumps may comprise Cu/SnAg solder balls having a pitch of less than 50 μm, or in some embodiments less than 30 μm. A potential drawback however is the high cost for processing of μ-bumps and the silicon interposer itself. This approach has been widely adopted for high bandwidth connectivity between chips inside a package.

A serializer/deserializer ("SerDes") is a transmission system that sends signals over a high-speed connection from a transmitter on one chip to a receiver on another. The SerDes transceiver converts parallel data into higher speed serial stream of data that is re-translated into parallel on the receiving end. In an example of a SerDes, a clock system puts parallel data into a serial by taking bits from the multiple streams and alternating them into a single stream, and vice versa. Both the serializer and deserializer are functional blocks on the transmitting and receiving chips.

As new ultra-low-power and low-area multi-Gb/s solutions become available, companies using μ-bumps for chip-chip connectivity inside package may want to connect to other chips with standard bumps over low-cost organic substrates without loss of bandwidth.

Thus, there remains a need for multi-purpose interface bumps on semiconductor chips to maximize chip-to-chip data connectivity.

SUMMARY

The following disclosure describes systems and methods for multi-purpose interface bumps on semiconductor chips to maximize chip-to-chip data connectivity, including for example high speed chip-to-chip interfaces using μ-bumps adaptable to interfaces with standard bumps without loss of total data rate.

In some embodiments, a chip with fine-pitch conductive pads for μ-bumps can be connected to an organic package substrate, but only every other pad may be populated with a bump and connected to the organic package substrate while adjacent pads are not populated with bumps and are deactivated. As a result, the total number of active bumps will reduce to one quarter of the original number of μ-bumps. To keep the total bandwidth the same, the remaining active bumps must provide at least 4× the data rate.

In some embodiments a data interface block on a semiconductor chip is configurable to transfer target data throughput either over N data lanes, with each data lane transferring 1/N the target data throughput. N number of fine-pitched bumps may be used to connect the data lanes to another semiconductor chip, or over one high-speed data lane transferring the full target data throughput when one coarse-pitched bump is used to connect the single high-speed data lane to the second semiconductor chip.

In some embodiments, a data interface may include one or more transceivers, or separate transmitters and/or receivers, to transmit and/or receive data signals between semiconductor chips, e.g., through fine-pitched or standard bumps connected to the transceivers and communicating through an interposer or substrate via high or low speed traces.

As used herein, the term "transceiver" is intended to encompass a transceiver and/or transceivers (e.g., a device or circuit for transmitting and/or receiving data signals) as well as a separate transmitter and/or receiver devices or circuits. Likewise, the phrase "transmitter and/or receiver" may be used to denote any of a transmitter, a receiver, or a combination transmitter and receiver (or transceiver).

In some embodiments, a data interface may include N low-speed transmitters plus one high-speed transmitter and/or N low-speed receivers plus one high-speed receiver through N low-speed transmitters plus one high-speed transmitter and/or N low-speed receivers plus one high-speed receiver. The data interface may be connected to another semiconductor chip over N data lanes using N fine-pitch bumps, and the N low-speed transmitters and/or N low-speed receivers may be activated and connected to the fine-pitched bumps, with high-speed transmitter and/or receiver deactivated or not connected to any bump. As discussed above, in each case, any or all of the transmitter(s) and/or receiver(s) may be a transceiver.

In other embodiments, a data interface may be connected to another semiconductor chip over one data lane using a single coarse-pitch bump, and the high-speed transmitter and/or the high-speed receiver maty be activated and connected to the coarse-pitched bump, with the N low-speed transmitter and/or receiver deactivated or not connected to any bump.

In some embodiments, a data interface may include N transmitters and/or N receivers that are placed together at a fine pitch and a common N:1 multiplexer and/or 1:N demultiplexer, where the N:1 multiplexer is configurable to connect to the N transmitters and multiplex their outputs to deliver a high-speed output at N times the data rate of each transmitter, and the 1:N demultiplexer configurable to connected to the N receivers inputs, and demultiplex a high-speed input to deliver N signals at 1/N the data rate of the high-speed input to the N receivers. If the data interface is connected to another semiconductor chip over N data lanes using N fine-pitch bumps, the N transmitters and/or N receivers may be directly connected the fine-pitched bumps.

As used herein the term "multiplexer/demultiplexer" (or "Mux/Demux") may be used to mean a multiplexer (Mux) device or circuit, a demultiplexer (Demux) device or circuit, or a combination multiplexer and demultiplexer device or circuit.

In other configurations of the latter embodiment, where the data interface may be connected to another semiconductor chip over one data lane using a single coarse-pitch bump, the single coarse-pitched bump is connected to the N:1 multiplexer and/or the 1:N demultiplexer.

In some embodiments, a data interface of may include of N transmitters and/or N receivers that are placed together at a fine pitch, wherein if the data interface is connected to another semiconductor chip over N data lanes using N fine-pitch bumps, the N transmitters and/or N receivers are directly connected the fine-pitched bumps.

In other configurations of the latter embodiment, where a data interface may be connected to another semiconductor chip over one data lane using a single coarse-pitch bump, the single coarse-pitched bump is connected to all N transmitters outputs, effectively forming a Wired-OR circuit, where N transmitters outputs are time-multiplexed by equally-spaced, or substantially equally spaced, clock phases, each clocking a transmitter, to generate a high-speed output signal at N times each transmitter output. Alternatively, the single coarse-pitched bump may be connected to all N receiver inputs where a high-speed input signal is time-demultiplexed by equally-spaced clock phases, each clocking a receiver, to generate N received signals at 1/N the rate of the high-speed input signal.

BRIEF DESCRIPTION OF THE DRAWINGS

Example embodiments are described herein with reference to the drawings.

Like reference numerals refer to the same or similar components throughout the several views of the drawings.

DETAILED DESCRIPTION

Figure 1:
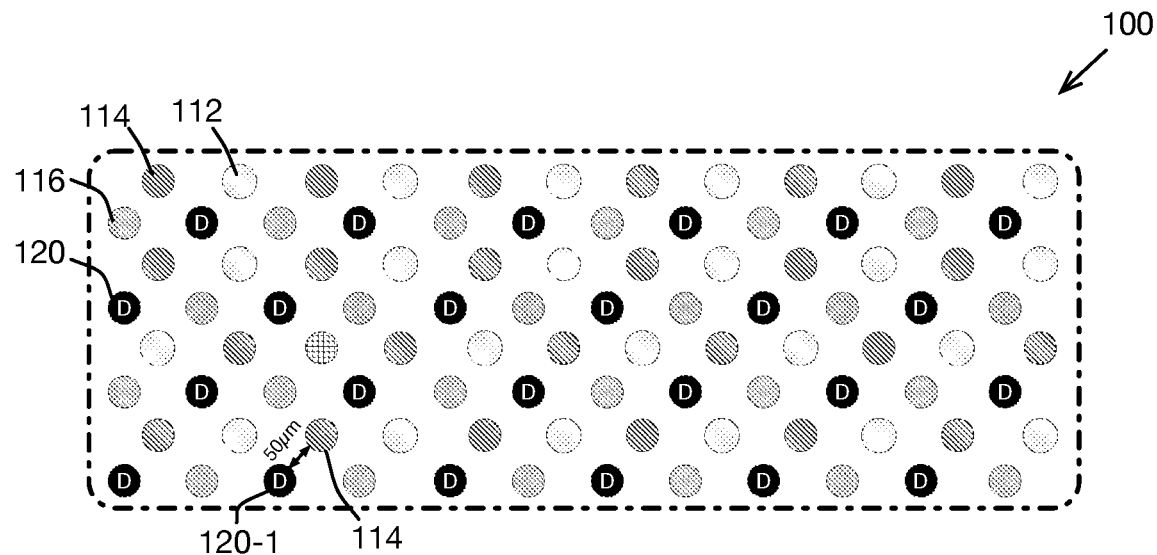
FIG. 1 is a schematic illustration of a chip interface having a staggered µ-bump pattern in accordance with one or more example embodiments.

Described herein are apparatus and methods for multi-purpose interface bumps on semiconductor chips to maximize chip-to-chip data connectivity, including for example high speed chip-to-chip interfaces using µ-bumps adaptable to interfaces with standard bumps without loss of total data rate.

The following embodiments are described in sufficient detail to enable those skilled in the art to make and use the invention. It is to be understood that other embodiments would be evident based on the present disclosure, and that process, materials or mechanical changes may be made without departing from the scope of the present invention.

In the following description, numerous examples and specific details are given to provide a thorough understanding of the invention. However, it will be apparent that the invention may be practiced without these specific details, may include some or all of the features in these examples alone or in combination with other features described below, and may further include modifications and equivalents of the features and concepts described herein. In order to avoid obscuring the present invention, some well-known circuits, board and system configurations, and process steps are not disclosed in detail. Likewise, the drawings showing embodiments of the devices are semi-diagrammatic and not to scale and, particularly, some of the dimensions are for the clarity of presentation and are shown greatly exaggerated in the drawing FIGS. Also, where multiple embodiments are disclosed and described having some features in common, for clarity and ease of illustration, description, and comprehension thereof, similar and like features one to another will ordinarily be described with like reference numerals.

Referring to FIG. 1, a chip interface 100 is shown having a pattern of fine-pitch μ-bumps 112, 114, 116, 120. The pattern of fine-pitch bumps may be staggered, for example with blocks of four (or any other desired number) bumps repeating across a surface of the chip. In some embodiments, the fine-pitch bumps 112, 114, 116, 120 may be spaced at a desired distance, e.g., approximately 50 μm is shown in FIG. 1 as the distance between adjacent fine-pitch bumps 114-1 and 120-1. Other desired patterns or distances may be employed.

In some embodiments, fine-pitch bumps 112, 114, 116, 120 may be finer pitch, high density solder μbump, and may be formed or fabricated using known materials and techniques. For example, Cu/SnAg (or any other desired material) solder microbump with a pitch of less than 50 μm, in some embodiments less than 30 μm, may be fabricated by an electroplating method or any other suitable method.

In some embodiments, each fine-pitch bump 112, 114, 116, 120 is capable of communicating data at M-Gb/s. For example, the chip interface 100 of FIG. 1 has a total of 96 fine-pitch bumps, thus the total data bandwidth is 96xM Gb/s.

Figure 2:
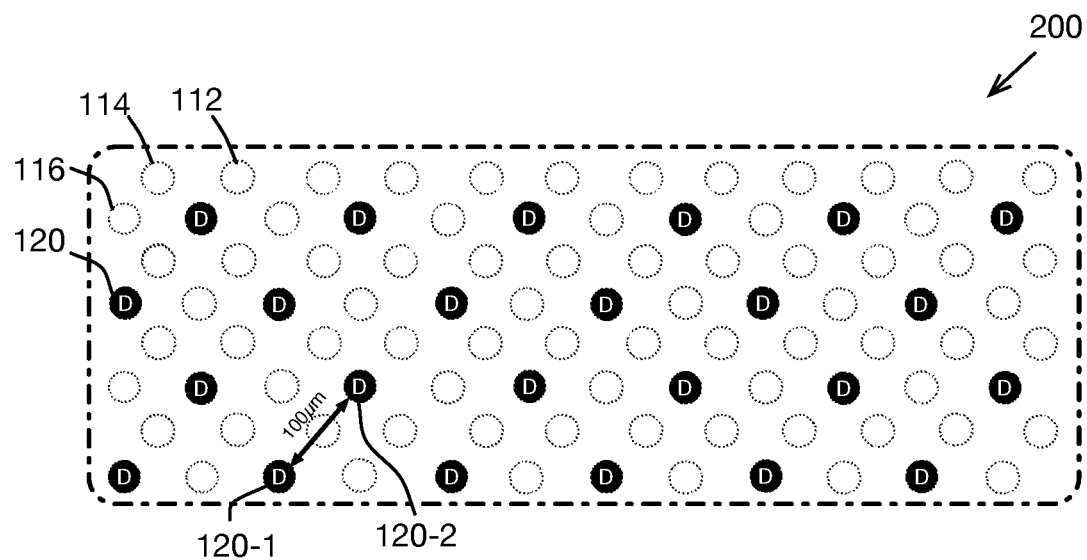
FIG. 2 is a schematic illustration of a chip interface having a staggered fine-pitch bump pattern, with all bumps adjacent to an active bump depopulated or deactivated in accordance with one or more example embodiments.

Referring to FIG. 2, an example chip interface 200 according to some embodiments may include a similar staggered pattern of bumps 112, 114, 116, 120, but with all bumps adjacent to each active bump 120 deactivated or depopulated.

In this example, the distance between adjacent "active" bumps, e.g., bumps 120-1 and 120-2, is approximately 100 μm or more. By enforcing the pitch to be at least 100 μm to be compatible with regular bumps, the total number of available bumps 120 in chip interface 200 will be 24 bumps, or 4 times fewer bumps number of regular bumps. In order to achieve the same total data bandwidth as in the fully populated fine-pitch bumps, the data rate per new active bumps should therefore increase by 4 times, or by a ratio equal to (new.pitch/old.pitch)$^2$.

In such example embodiments, the data rate of the 24 new active bumps should be 4xMGb/s, and with 24 of them in this example, we still get a total bandwidth of 96xM Gb/s as described above using fine-pitch bump pitch, e.g., interface 100 in FIG. 1.

Such depopulation or deactivation of the bumps 112, 114, 116 with tight pitch as described herein, such that new active bumps 120 have similar pitch (or spacing between active bumps 120) to the regular bumps (or practical pitch in organic substrate packages), enables a chip 200 to be capable of being connected to another chip with same fine-pitch bump pattern or to a chip with coarse-pitch bump pattern over 1/N the number of traces.

Adding the capability that one active bump 120 out of N fine-pitch bumps (in our example N=4) runs at N times higher bandwidth, may allow one to keep the total data bandwidth of the chip the same over interposer or organic substrate.

In some embodiments, an interface, or input/output (IO) running N-times faster needs more complex and larger circuitry than can fit under a single fine-pitch bump area, but a N-times faster IO together with the other (N-1) slower IOs can fit under N fine-pitch bumps area, which is at least one reason solutions such as those described herein are possible.

Figure 3:
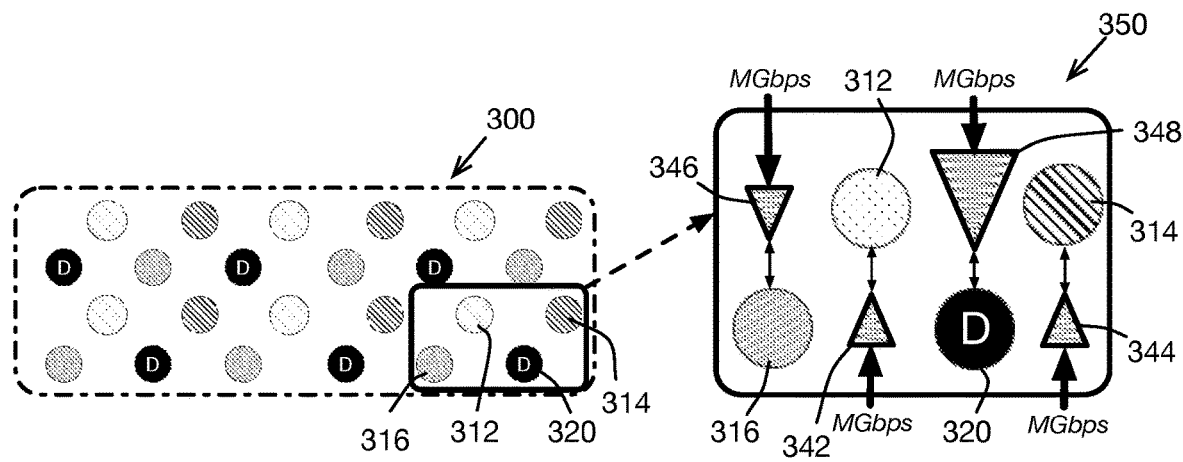
FIG. 3 is a schematic illustration of a portion of a chip interface having a staggered fine-pitch bump pattern, including an expanded view of a block of fine-pitch bumps with associated transceivers, in accordance with one or more example embodiments.

FIG. 3 is another schematic illustration of a portion of a chip interface 300 with a staggered repeating pattern of fine-pitch bumps 312, 314, 316, 320, where each may be spaced from adjacent bumps by approximately 50 μm. An expanded view in block 350 shows each of bumps 312, 314, 316, 320 connected with an associated transceiver 342, 344, 346, 348, respectively. Each transceiver may be used to transmit and receive data signals to or from associated bumps.

In the example embodiment 300 of FIG. 3, all fine-pitch bumps 312, 314, 316, 320 may be connected and active, with each IO transceiver operating at M-Gbps, for a total data rate of 4xM-Gbps per block of four fine-pitch bumps, or 96xM-Gbps for the chip interface 300.

Figure 4:
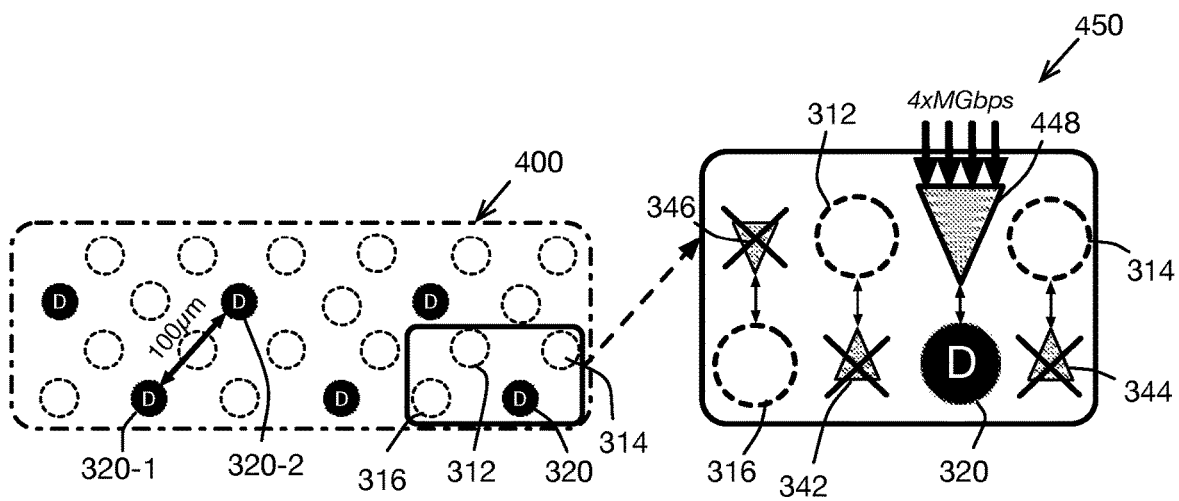
FIG. 4 is a schematic illustration of a portion of a chip interface as in having a staggered fine-pitch bump pattern as in FIG. 3, but with all bumps adjacent to the active bumps depopulated or deactivated, a high speed transceiver connected to the active bump, and transceivers associated with the deactivated bumps deactivated in accordance with one or more example embodiments.

Turning now to FIG. 4, a portion 400 of a chip interface is shown with an expanded view of a functional block 450, similar to interface portion 300 and block 350, respectively, of FIG. 3. However, in this example segment 400 bumps 312, 314, and 316 adjacent to active bump 320 are depopulated or deactivated such that there is a space between active bumps of approximately 100 μm. Also, in this example bump 320 is connected to higher speed transceiver 448, which is populated and active. The higher speed transceiver 448 operates at 4xM-Gbps to deliver the same total throughput per block as in FIG. 3.

In some embodiments, each block 450 includes N number of fine-pitch bumps (in this example N=4) that in the other mode N-1 are not populated (or not active) and the remaining active bump 320 receives data of the all N channels and operates at N times the output data rate of FIG. 3 above with all bumps 312, 314, 316, and 320 active.

Figure 5:
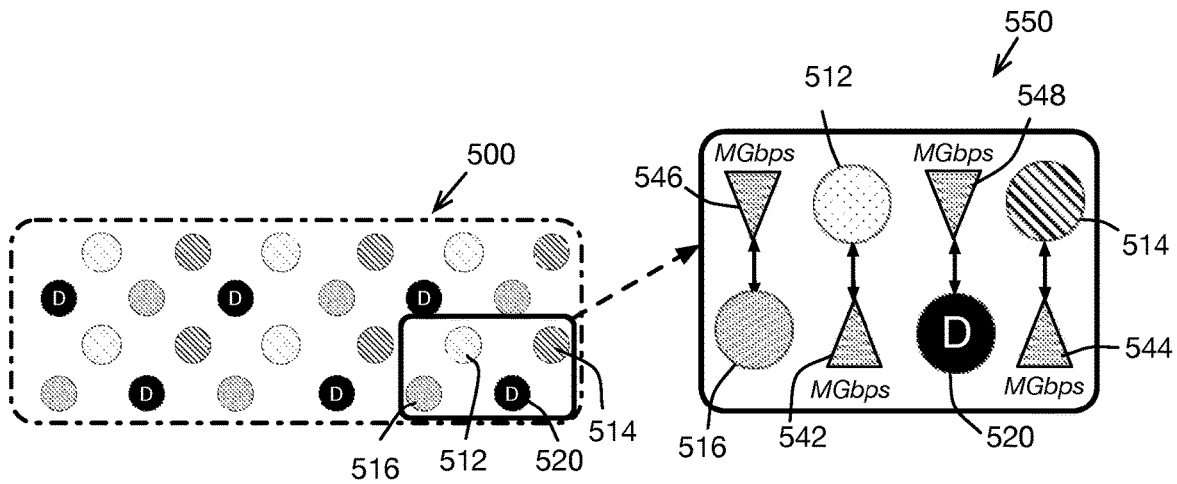
FIG. 5 is a schematic illustration of a portion of another chip interface having a staggered fine-pitch bump pattern, including an expanded view of a block of bumps with associated transceivers, in accordance with one or more example embodiment.

Referring to FIG. 5, another example of a chip interface 500 may include a staggered pattern of fine-pitch bumps 512, 514, 516, 520, similar to chip interface 300 of FIG. 3. Expanded view of a block 550 shows each bump 512, 514, 516, 520 connected to a corresponding transceiver 542, 544, 536, 548, respectively. In some embodiments, each IO transceiver 542, 544, 546, 548 operates a M-Gbps data rate, for a total data rate for the block 550 of 4xM-Gbps. In this example, all bumps in chip interface 500 may be connected and active with each transceiver operating at M-Gbps.

Figure 6:
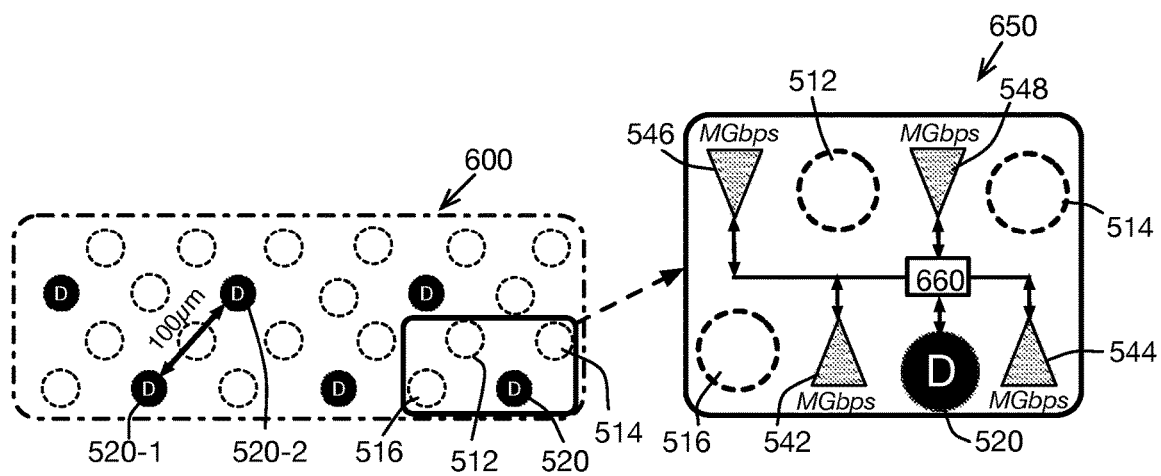
FIG. 6 is a schematic illustration of a portion of a chip interface as in having a staggered fine-pitch bump pattern and depopulated or deactivated adjacent bumps as in FIG. 6, with an expanded view of a block showing transceivers associated with the depopulated or deactivated bumps connected to the active bump by a multiplexer/demultiplexer in accordance with one or more example embodiments.

Referring to FIG. 6, chip interface 600 has bump 520 active while adjacent bumps 512, 514, 520 in each block are depopulated or deactivated, thereby providing a distance of approximately 100 μm between active bumps, e.g., 520-1 and 520-1. The expanded view of block 650 shows depopulated or inactive bumps 512, 514, and 516. In this example, all transceivers 542, 544, 546, 548 are connected to the active bump 520 by a multiplexer/demultiplexer 660.

The original IO transceivers 542, 544, 546, 548 may all be active and operating at same M-Gbps, while only one bump 520 in the block 650 is populated. The outputs of the transceivers are time multiplexed and/or demultiplexed into the active bump 520.

In some embodiments, multiplexing (or demultiplexing) may be implemented by including a Mux (or Demux) stage 660 in the block 650. In such a depopulated bump case, the Mux (or the Demux) 660 is connected to the active bump 520 on one side and the N transmitters (or N receivers) 542, 544, 546, 548 on the other side of the Mux/Demux 660.

In some embodiments, each block of chip interface 600 includes N number of fine-pitch bumps (in this example N=4). Where, as in example block 650, N−1 bumps are not populated, the remaining active bump 520 operates at N times the data rate (or 4xM-Gbps), as compared to 1xM-Gbps for each fine-pitch bump as shown in FIG. 5 where all fine-pitch bumps are populated and active.

Figure 7A:
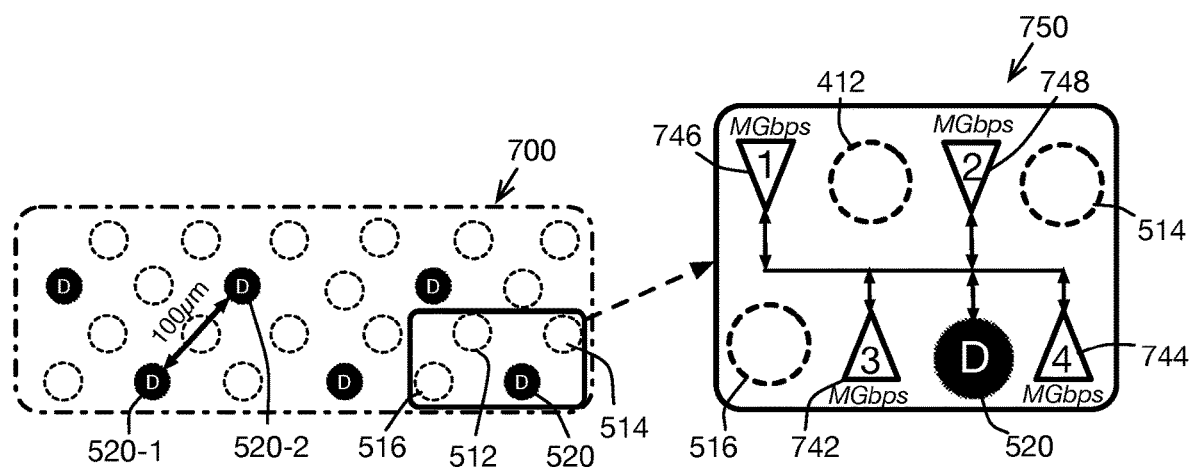
FIG. 7A is a schematic illustration of the portion of the chip interface and expanded block as in FIG. 6, but with all transceivers connected and time multiplexed/demultiplexed into the active bump, in accordance with one or more example embodiments.
Figure 7B:
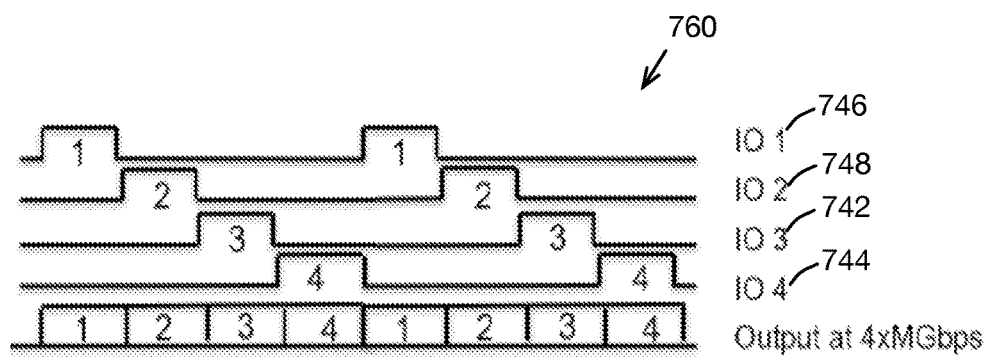
FIG. 7B is a schematic illustration of the multiplex/demultiplex timing sequence for transceivers of FIG. 7A in accordance with one or more example embodiments.

Turning now to FIGS. 7A and 7B, an example portion of chip interface 700 is similar to interface 600 of FIG. 6, with each block of fine-pitch bumps 512, 514, 516 and 520 having all but bump 520 deactivated (or depopulated). As described above, the space between adjacent active bumps is therefore greater, e.g., approximately 100 µm between 520-1 and 520-1. In contrast to block 656 of FIG. 6, the expanded view of 750 shows all transceivers 742, 744, 746, 748 connected and time multiplexed/demultiplexed into the active bump, where each transceiver 742, 744, 746, and 748 may be designated by a time sequence number 1, 2, 3, and 4, respectively.

In this example, the original transceivers are all active and operating at the same M-Gbps, but only one bump 520 is populated. The transceiver outputs are time multiplexed/demultiplexed into the active bump, as shown by the output sequence chart 760 in FIG. 7B.

To avoid the parasitic effects of extra wires, instead of including metal wires to cover both cases (fully populated and 1/N populated bumps), some embodiments may utilize different metal routes (layouts) for each case. The option to have two different metal routings, or layouts, may provide the option to implement time multiplexing (or demultiplexing) by just shorting N (in figure here N=4) transceivers output per block, and activate the output of each N transceiver periodically one at a time (non-overlapping) for 1/N of the period. This implementation may employ two or more different metal layouts but eliminates the need to include actual active Mux or Demux circuits, e.g., 660 in FIG. 6.

In some embodiments, different metal layouts can be limited to only one metal layer to minimize the cost associated with different set of lithography masks.

Figure 8A:
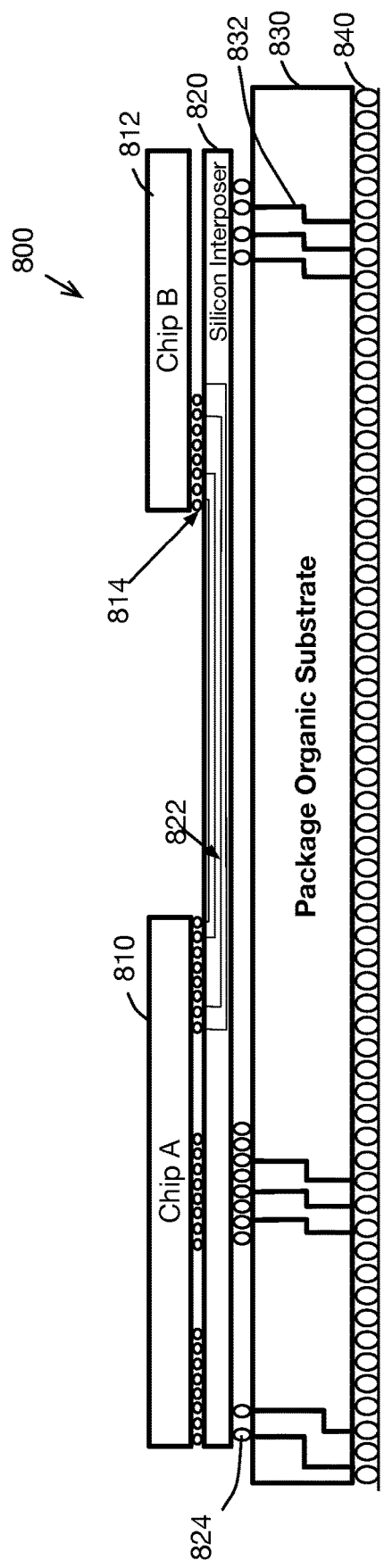
FIG. 8A is a side view schematic illustration of an example interface including chips communicating through fine-pitch µ-bumps and wide low-speed traces in a silicon interposer, in accordance with one or more example embodiments.

FIG. 8A is a side view schematic illustration of an example interface 800 including chips 810, 812 communicating through fine-pitch µ-bumps 814 and wide low-speed traces 822 in a silicon interposer 820, in accordance with one or more example embodiments. Interposer 820 may be connected to package organic substrate 830 by bumps 824 and through one or more vias to package balls 840.

Figure 8B:
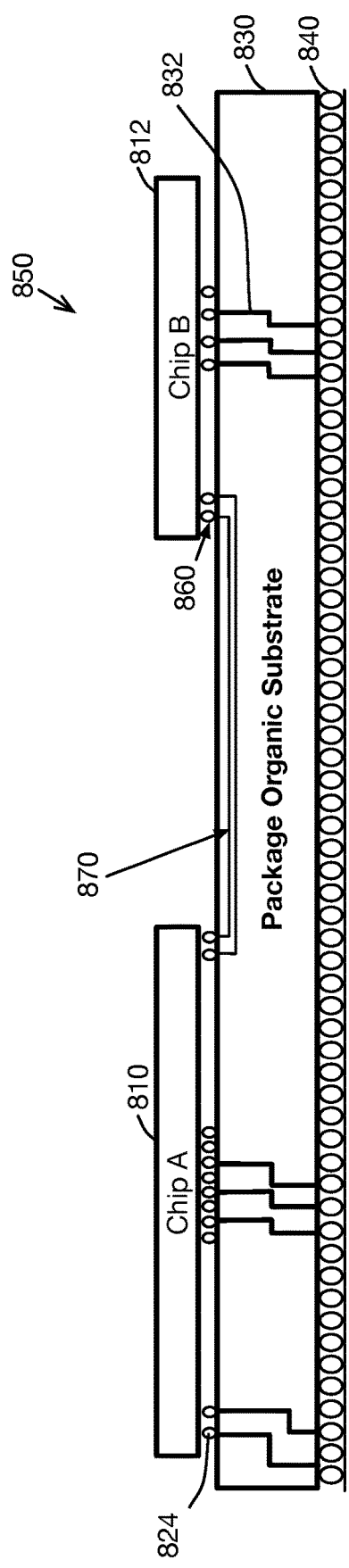
FIG. 8B is a side view schematic illustration of an example high-speed SerDes interface over an ultra-short reach link, including chips communicating through standard or coarse-pith bumps and high-speed traces over organic substrate.

Referring to FIG. 8B, is a side view schematic illustration of a high-speed SerDes interface 850 over an ultra-short reach link is shown, with chips 810 and 820 connected through standard or coarse-pitch bumps 860 on each chip 810 and 812 via high-speed traces 870 over organic substrate 830. Each chip 810, 812 may also be connected to package balls 840 on an opposite side of package organic substrate 830 by bumps 824 and vias 832.

In each example embodiment 800 and 850, different arrangements of activated and deactivate (or populated and depopulated) bumps, transceivers, and/or multiplexor/demultiplexor circuits or timing schemes may be employed to optimize data throughput in accordance with the various example interface apparatus and methods described herein.

The foregoing description illustrates various embodiments of the present invention along with examples of how aspects of the present invention may be implemented. The above examples and embodiments should not be deemed to be the only embodiments, and are presented to illustrate the flexibility and advantages of the present invention. Based on the above disclosure and the following claims, other arrangements, embodiments, implementations and equivalents will be evident to those skilled in the art and may be employed without departing from the spirit and scope of the invention.

What is claimed is:

1. A data interface block on a first semiconductor chip comprising pads configurable to transfer a target data throughput either over N data lanes, where N is an integer greater than zero, with each of the N data lanes transferring 1/N of the target data throughput, wherein N fine-pitched bumps deposited on the pads are used to connect the N data lanes to a second semiconductor chip, or over a high-speed data lane transferring the target data throughput when a coarse-pitched bump on one of the pads is used to connect the high-speed data lane to the second semiconductor chip, wherein the data interface block further comprising N low-speed transmitter plus one high-speed transmitter and/or N low-speed receivers plus one high-speed receiver, wherein, when the data interface is connected to the second semiconductor chip over N data lanes using the N fine-pitch bumps, the N low-speed transmitters and/or N low-speed receivers are activated or connected to the fine-pitched bumps, with the high-speed transmitter and/or receiver deactivated or not connected to any bump.

2. The data interface block of claim 1, wherein any of the N low-speed transmitters and/or N low-speed receivers are a low speed transceiver, and the high-speed transmitter and/or high-speed receiver is a high-speed transceiver.

3. The data interface block of claim 1, comprising N transmitters and/or N receivers that are placed together at a fine pitch and a common N:1 multiplexer and/or 1:N demultiplexer, wherein the N:1 multiplexer is configurable to connect to the N transmitters and multiplex their outputs to deliver a high-speed output at N times the data rate of each transmitter, and the 1:N demultiplexer configurable to connected to the N receivers inputs, and demultiplex a high-speed input to deliver N signals at 1/N the data rate of the high-speed input to the N receivers, wherein, if the data interface block is connected to the second semiconductor chip over N data lanes using N fine-pitch bumps, the N transmitters and/or N receivers are directly connected to the fine-pitched bumps.

4. The data interface block of claim 1 comprising N transmitters and/or N receivers that are placed together at a fine pitch and a common N:1 multiplexer and/or 1:N demultiplexer, where the N:1 multiplexer is configurable to connect to the N transmitters and multiplex their outputs to deliver a high-speed output at N times a data rate of each transmitter, and the 1:N demultiplexer configurable to connected to the N receivers inputs, and demultiplex a high-speed input to deliver N signals at 1/N a data rate of the high-speed input to the N receivers, wherein, if the data interface block is connected to the other semiconductor chip over one data lane using a single coarse-pitch bump, the single coarse-pitched bump is connected to the N:1 multiplexer and/or the 1:N demultiplexer.

5. The data interface block of claim 1 comprising N transmitters and/or N receivers that are placed together at a fine pitch, wherein, if the data interface block is connected to the second semiconductor chip over N data lanes using N fine-pitch bumps, the N transmitters and/or N receivers are directly connected to the fine-pitched bumps.

6. The data interface block of claim 1 comprising N transmitters and/or N receivers that are placed together at a fine pitch, wherein, if the data interface block is connected to the second semiconductor chip over one data lane using a single coarse-pitch bump, the single coarse-pitched bump is connected to all N transmitters outputs where N transmitters outputs are time-multiplexed by substantially equally-spaced clock phases, each clocking a transmitter, to generate a high-speed output signal at N times each transmitter output, and/or the single coarse-pitched bump is connected to all N receivers inputs where a high-speed input signal is time-demultiplexed by equally-spaced clock phases, each clocking a receiver, to generate N received signals at 1/N the rate of the high-speed input signal.

7. A data interface block on a first semiconductor chip comprising pads configurable to transfer a target data throughput either over N data lanes, where N is an integer greater than zero, with each of the N data lanes transferring 1/N of the target data throughput, wherein N fine-pitched bumps deposited on the pads are used to connect the N data lanes to a second semiconductor chip, or over a high-speed data lane transferring the target data throughput when a coarse-pitched bump on one of the pads is used to connect the high-speed data lane to the second semiconductor chip, the data interface block further comprising N low-speed transmitters plus one high-speed transmitter and/or N low-speed receivers plus one high-speed receiver, wherein, when the data interface block is connected to the other semiconductor chip over the single high-speed data lane using a single coarse-pitch bump, the high-speed transmitter and/or the high-speed receiver are activated or connected to the coarse-pitched bump, with the N low-speed transmitters and/or receivers deactivated or not connected to any bump.

8. The data interface block of claim 7, wherein any of the N low-speed transmitter and/or receivers, the high speed transmitter, or the high-speed receiver is a transceiver.

* * * * *